US010715095B2

(12) United States Patent
Long et al.

(10) Patent No.: US 10,715,095 B2
(45) Date of Patent: Jul. 14, 2020

(54) RADIOFREQUENCY (RF) FILTER FOR MULTI-FREQUENCY RF BIAS

(71) Applicant: Lam Research Corporation, Fremont, CA (US)

(72) Inventors: Maolin Long, Santa Clara, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 309 days.

(21) Appl. No.: 15/727,516

(22) Filed: Oct. 6, 2017

(65) Prior Publication Data

US 2019/0109576 A1    Apr. 11, 2019

(51) Int. Cl.
*H03H 7/01* (2006.01)
*G01S 13/00* (2006.01)
*H05B 6/66* (2006.01)

(52) U.S. Cl.
CPC .......... *H03H 7/0153* (2013.01); *G01S 13/00* (2013.01); *H05B 6/664* (2013.01)

(58) Field of Classification Search
CPC .......... G01S 13/00; G01S 7/282; G01S 7/285; G01S 7/35; G01S 7/352; H03H 2001/0014; H03H 2001/005; H03H 2001/0092; H03H 2001/0078; H03H 7/0153; H03H 7/09; H03H 2210/026
See application file for complete search history.

(56) References Cited

U.S. PATENT DOCUMENTS

| 7,212,078 | B2 * | 5/2007 | Windhorn | ......... H01J 37/32082 333/17.3 |
| 8,416,052 | B2 * | 4/2013 | MacLennan | ......... H01F 27/255 336/233 |
| 2007/0284344 | A1 * | 12/2007 | Todorov | ......... H01J 37/32706 219/121.54 |
| 2008/0197780 | A1 * | 8/2008 | Yamazawa | ........ H01J 37/32091 315/111.21 |
| 2011/0050361 | A1 * | 3/2011 | Li | ........................ H03H 1/0007 333/168 |

(Continued)

OTHER PUBLICATIONS

International Search Report and Written Opinion of the International Searching Authority, PCT/US2018/053918, dated Feb. 1, 2019, 5 pages.

*Primary Examiner* — Peter M Bythrow
(74) *Attorney, Agent, or Firm* — Penilla IP, APC

(57) ABSTRACT

A radiofrequency (RF) filter includes an inductive element having multiple coil sections collectively forming an undivided coil of a cable of twisted magnetic wires. At least two adjacent coil sections have different turn pitches. The cable of twisted magnetic wires includes two wires per channel and is configured for at least one channel. The cable of twisted magnetic wires at a first end of the inductive element is configured for connection to an electrical component that is to receive power from a power supply. The cable of twisted magnetic wires at a second end of the inductive element is configured for connection to the power supply. Terminating capacitive elements are electrically connected between a reference ground potential and a respective wire of the cable of twisted magnetic wires at respective locations between the second end of the inductive element and the power supply.

19 Claims, 11 Drawing Sheets

(56) References Cited

U.S. PATENT DOCUMENTS

| | | | |
|---|---|---|---|
| 2011/0050362 A1* | 3/2011 | Li | H03H 1/0007 |
| | | | 333/168 |
| 2011/0102103 A1* | 5/2011 | Li | H03H 7/0115 |
| | | | 333/175 |
| 2012/0032756 A1* | 2/2012 | Long | H01J 37/32174 |
| | | | 333/181 |
| 2016/0028362 A1* | 1/2016 | Jafarian-Tehrani | H03H 7/06 |
| | | | 333/17.1 |
| 2017/0069464 A1* | 3/2017 | Ye | H01L 21/6831 |
| 2019/0207579 A1* | 7/2019 | O'Brien | H01F 27/28 |

\* cited by examiner

Connect an RF filter between a power supply and an electrical component that is to receive power from the power supply, the RF filter including:

- an inductor having at least two coil sections collectively forming an undivided coil of a cable of twisted magnetic wires, where each coil section includes a portion of the undivided coil of the cable of twisted magnetic wires configured at a corresponding turn pitch, and where at least two adjacent coil sections have different turn pitches, and where the cable of twisted magnetic wires includes two wires per channel and is configured for at least one channel, and where the cable of twisted magnetic wires at a first end of the inductor is connected to the electrical component, and where the cable of twisted magnetic wires at a second end of the inductor is connected to the power supply,

- a separate terminating capacitor for each wire of the cable of twisted magnetic wires, where each terminating capacitor is electrically connected between a reference ground potential and a respective wire of the cable of twisted magnetic wires at a location between the second end of the inductor and the power supply.

Transmit electrical power from power supply to wires within an input arrangement, where the wires are connected to respective capacitive elements, and where each separate pair of the wires is designated to provide electrical power to an electrical component that is exposed to RF power.

703

Pass electrical power from the wires within the input arrangement to corresponding magnetic wires within a cable of twisted magnetic wires at an input of an inductive element, where the inductive element includes at least two coil sections collectively forming an undivided coil of the cable of twisted magnetic wires between the input of the inductive element and an output of the inductive element, and where each coil section includes a portion of the undivided coil of the cable of twisted magnetic wires configured at a corresponding turn pitch, and where at least two adjacent coil sections have different turn pitches.

705

Pass electrical power from the magnetic wires within the cable of twisted magnetic wires at the output of the inductive element to corresponding wires connected to the electrical component that is exposed to RF power.

Fig. 7

RADIOFREQUENCY (RF) FILTER FOR MULTI-FREQUENCY RF BIAS

BACKGROUND

1. Field of the Disclosure

The present disclosure relates to semiconductor fabrication equipment.

2. Description of the Related Art

In various semiconductor fabrication processes, radiofrequency (RF) power is transmitted to a processing chamber to generate plasma and/or generate bias voltage. One or more other electrically powered components, such as a heater assembly, can be operated in exposure to the RF power. For example, the heater assembly can be configured and disposed to heat a component or region within the processing chamber. The RF power used to generate the plasma and/or bias voltage can interfere with and/or cause damage to a power supply. It is necessary to prevent the RF power from interfering with and/or causing damage to the power supply. Additionally, connection of a heater power supply to heating elements that are embedded in an RF electrode within the processing chamber can load the RF power to reduce its efficiency. An RF filter is required to isolate the RF electrode from the heater power supply, which is either AC (alternating current) or DC (direct current), so that AC or DC power can be provided to the heating elements within the RF electrode without RF power intrusion within the AC or DC supply path. It is within this context that the present disclosure arises.

SUMMARY

In an example embodiment, a radiofrequency (RF) filter is disclosed. The RF filter includes an inductive element that includes at least two coil sections collectively forming an undivided coil of a cable of twisted magnetic wires. Each coil section includes a portion of the undivided coil of the cable of twisted magnetic wires configured at a corresponding turn pitch. At least two adjacent coil sections have different turn pitches. The cable of twisted magnetic wires includes two wires per channel and is configured for at least one channel. The cable of twisted magnetic wires at a first end of the inductive element is configured for connection to an electrical component. The electrical component is to receive power from a power supply that is either a DC power supply or an AC power supply. The cable of twisted magnetic wires at a second end of the inductive element is configured for connection to the power supply. The RF filter also includes a set of terminating capacitive elements that includes a separate terminating capacitive element for each wire of the cable of twisted magnetic wires. Each terminating capacitive element is electrically connected between a reference ground potential and a respective wire of the cable of twisted magnetic wires at a location between the second end of the inductive element and the power supply.

In an example embodiment, a method is disclosed for filtering RF power. The method includes having an RF filter between a power supply and an electrical component that is to receive power from the power supply. The power supply is either a DC power supply or an AC power supply. The RF filter includes an inductive element having at least two coil sections collectively forming an undivided coil of a cable of twisted magnetic wires. Each coil section includes a portion of the undivided coil of the cable of twisted magnetic wires configured at a corresponding turn pitch. At least two adjacent coil sections have different turn pitches. The cable of twisted magnetic wires includes two wires per channel and is configured for at least one channel. The cable of twisted magnetic wires at a first end of the inductive element is connected to the electrical component. The cable of twisted magnetic wires at a second end of the inductive element is connected to the power supply. The RF filter also includes a separate terminating capacitive element for each wire of the cable of twisted magnetic wires. Each terminating capacitive element is electrically connected between a reference ground potential and a respective wire of the cable of twisted magnetic wires at a location between the second end of the inductive element and the power supply.

In an example embodiment, a method is disclosed for filtering RF power. The method includes transmitting electrical power from a power supply to wires within an input arrangement. The wires are connected to respective capacitive elements. Each separate pair of the wires is designated to provide electrical power to an electrical component that is exposed to RF power. The method also includes passing electrical power from the wires within the input arrangement to corresponding magnetic wires within a cable of twisted magnetic wires, at an input of an inductive element. The inductive element includes at least two coil sections collectively forming an undivided coil of the cable of twisted magnetic wires between the input of the inductive element and an output of the inductive element. Each coil section includes a portion of the undivided coil of the cable of twisted magnetic wires configured at a corresponding turn pitch. At least two adjacent coil sections have different turn pitches. The method also includes passing electrical power from the magnetic wires within the cable of twisted magnetic wires at the output of the inductive element to corresponding wires connected to the electrical component that is exposed to RF power.

Other aspects and advantages will become more apparent from the following detailed description, taken in conjunction with the accompanying drawings, provided by way of example.

BRIEF DESCRIPTION OF THE DRAWINGS

FIG. 6 presents a method for filtering RF power, in accordance with some embodiments of the present disclosure.

FIG. 7 presents a method for filtering RF power, in accordance with some embodiments of the present disclosure.

DETAILED DESCRIPTION

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

In the semiconductor industry, semiconductor substrates can undergo fabrication operations in various types of plasma chambers, such as capacitively coupled plasma (CCP) processing chamber and inductively coupled plasma (ICP) plasma processing chambers. In both CCP and ICP processing chambers, radiofrequency (RF) power is used to energize a process gas to transform the process gas into a plasma. Reactive species and/or charged species within the plasma are directed to interact with the substrate to modify a condition of the substrate, such as by modifying a material present on the substrate, or depositing material on the substrate, or removing/etching material from the substrate, by way of example. Also, the CCP and ICP processing chambers can be equipped with one or more electrodes that receive RF power to generate a bias voltage for accelerating charged species from the plasma toward the substrate. The CCP and ICP processing chambers can also be equipped with one or more electrically powered components, such as a heater assembly, that receive electrical power from one or more power supplies, where each of the one or more power supplies is either a DC (direct current) power supply or an AC (alternating current) power supply. It is necessary to ensure that the RF power used to generate the plasma and/or the bias voltage does not travel into the power supplies (DC or AC power supplies) that are used to supply electrical power to the one or more electrically powered components, such as the heater assembly. Various embodiments of an RF filter and associated inductor, as disclosed herein, are suitable for preventing transmission of RF power into DC and/or AC power supplies associated with operation of the CCP and ICP processing chambers.

Figure 1A:
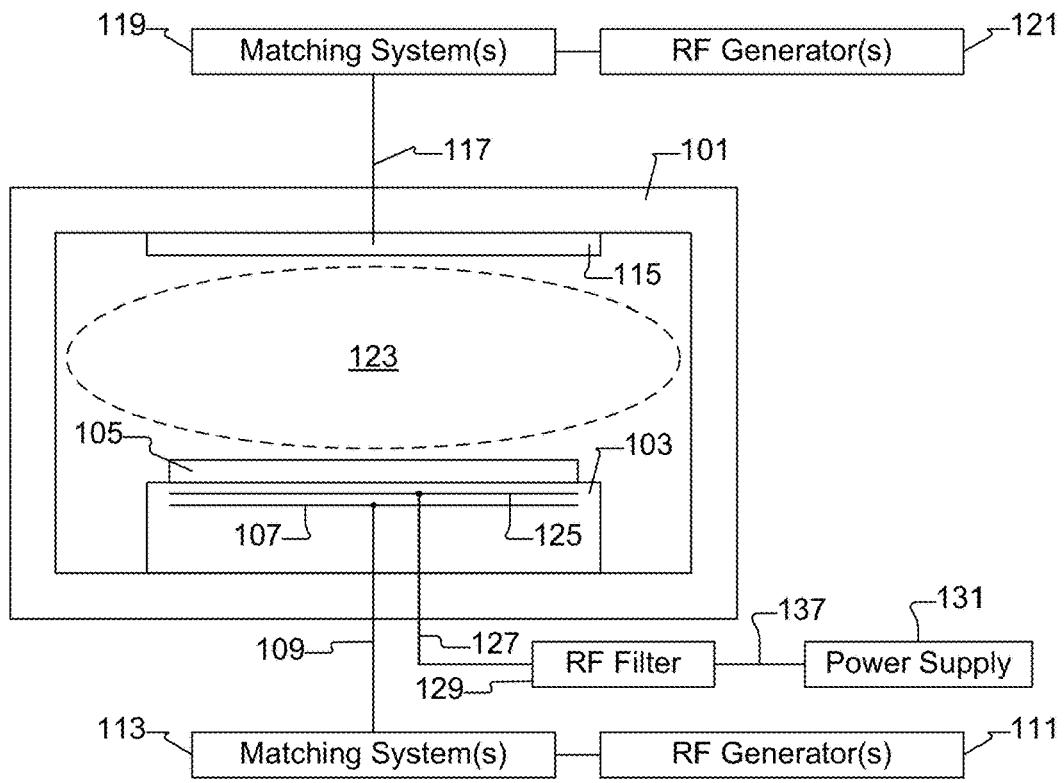
FIG. 1A shows an example vertical cross-section diagram of a CCP processing chamber, in accordance with some embodiments of the present disclosure.

FIG. 1A shows an example vertical cross-section diagram of a CCP processing chamber 101, in accordance with some embodiments of the present disclosure. The CCP processing chamber 101 defines a processing volume within which a plasma 123 is generated in exposure to a substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material 105 present on the substrate 105. In some embodiments, the substrate 105 is a semiconductor wafer undergoing a fabrication procedure. However, it should be understood that in various embodiments, the substrate 105 can be essentially any type of substrate that is subjected to a plasma-based fabrication process. For example, in some embodiments, substrate 105 as used herein can refer to substrates formed of silicon, sapphire, GaN, GaAs or SiC, or other substrate materials, and can include glass panels/substrates, metal foils, metal sheets, polymer materials, or the like. Also, in various embodiments, the substrate 105 as referred to herein may vary in form, shape, and/or size. For example, in some embodiments, the substrate 105 referred to herein may correspond to a 200 mm (millimeters) semiconductor wafer, a 300 mm semiconductor wafer, or a 450 mm semiconductor wafer. Also, in some embodiments, the substrate 105 referred to herein may correspond to a non-circular substrate, such as a rectangular substrate for a flat panel display, or the like, among other shapes.

In various embodiments, the CCP processing chamber 101 operates by flowing one or more process gases into the processing volume, and by applying RF power to the one or more process gases to transform the one or more process gases into the plasma 123 in exposure to the substrate 105, in order to affect a change in material or surface condition on the substrate 105. The CCP processing chamber 101 includes a substrate support structure 103 upon which the substrate 105 is positioned and supported during processing operations. In some embodiments, an electrode 107 is disposed within the substrate support structure 103 to provide for transmission of RF power from the electrode 107 through the processing volume to generate the plasma 123 and/or control ion energy. The electrode 107 is connected to receive RF power through an RF feed structure 109, which is connected to one or more RF power generator(s) 111 by way of one or more impedance matching system(s) 113. The impedance matching system(s) 113 include an arrangement of capacitors and inductors configured to ensure that an impedance seen by the RF power generator(s) 111 at the input of the impedance matching system(s) 113 is sufficiently close to an output impedance for which the RF power generator(s) 111 is designed to operate (usually 50 Ohm), so that RF power generated and transmitted by the RF power generator(s) 111 will be transmitted into the processing volume in an efficient manner, e.g., without unacceptable or undesirable reflection.

Also, in some embodiments, an upper electrode 115 can also be provided. In various embodiments, the upper electrode 115 can provide either an electrical ground electrode or can be used to transmit RF power into the processing volume. In some embodiments, the upper electrode 115 is connected to receive RF power through an RF feed structure 117, which is connected to one or more RF power generator(s) 121 by way of one or more impedance matching system(s) 119. The impedance matching system(s) 119 include an arrangement of capacitors and inductors configured to ensure that an impedance seen by the RF power generator(s) 121 at the input of the impedance matching system(s) 119 is sufficiently close to an output impedance for which the RF powers generator(s) 121 is designed to operate (usually 50 Ohm), so that RF power generated and transmitted by the RF power generator(s) 121 will be transmitted into the processing volume in an efficient manner, e.g., without unacceptable or undesirable reflection.

In some embodiments, a heater assembly 125 is disposed within the substrate support structure 103 to provide temperature control of the substrate 105. The heater assembly 125 is electrically connected to receive electrical power through an electrical connection 127, where the electrical power is supplied from a power supply 131 through an electrical connection 137 to an RF filter 129, and through the RF filter 129 to the electrical connection 127. In some embodiments, the power supply 131 is an alternating current (AC) power supply. In some embodiments, the power supply 131 is a direct current (DC) power supply. In some embodiments, the heater assembly 125 includes a plurality of electrical resistance heating elements. The RF filter 129 is configured to prevent RF power from entering the power supply 131, while allowing transmission of electrical current between the power supply 131 and the electrical connection 127.

In some embodiments, the heater assembly 125 includes multiple heating elements. FIG. 1C shows a top view of an example heater assembly 125 that includes four concentrically configured and positioned heating elements 132, 133, 134, 135, in accordance with some embodiments of the present disclosure. The heating element 132 corresponds to an inner heating zone that is substantially centered in a horizontal direction relative to an area of the substrate support structure 103 configured to receive and support the substrate 105. The heating element 133 corresponds to a middle-inner heating zone configured to radially circumscribe the inner heating zone. The heating element 134 corresponds to a middle-outer heating zone configured to radially circumscribe the middle-inner heating zone. The heating element 135 corresponds to a outer heating zone configured to radially circumscribe the middle-outer heating zone. In the example heater assembly 125 of FIG. 1C, each of the heating elements 132, 133, 134, 135 is connected to receive separate and independently controlled electrical power from the power supply 131. More specifically, each of the heating elements 132, 133, 134, 135 is exclusively connected to two wires within the electrical connection 127. Therefore, to accommodate the four heating elements 132, 133, 134, 135, the electrical connection 127 includes eight wires 132A, 132B, 133A, 133B, 134A, 134B, 135A, 135B as shown in FIG. 1C. Also, in the example of FIG. 1C, each of the eight wires 132A, 132B, 133A, 133B, 134A, 134B, 135A, 135B is respectively connected through the RF filter 129 to eight wires 137A, 137B, 137C, 137D, 137E, 137F, 137G, 137H (137A-137H) that form the electrical connection 137 between the power supply 131 and the RF filter 129. It should be understood that the heater assembly 125 of FIG. 1C is shown by way of example. In various embodiments, the heater assembly 125 can include either less than four heating elements or more than four heating elements, with each heating element having a dedicated pair of wires for receiving electrical power from the power supply 131 through the RF filter 129.

Figure 1B:
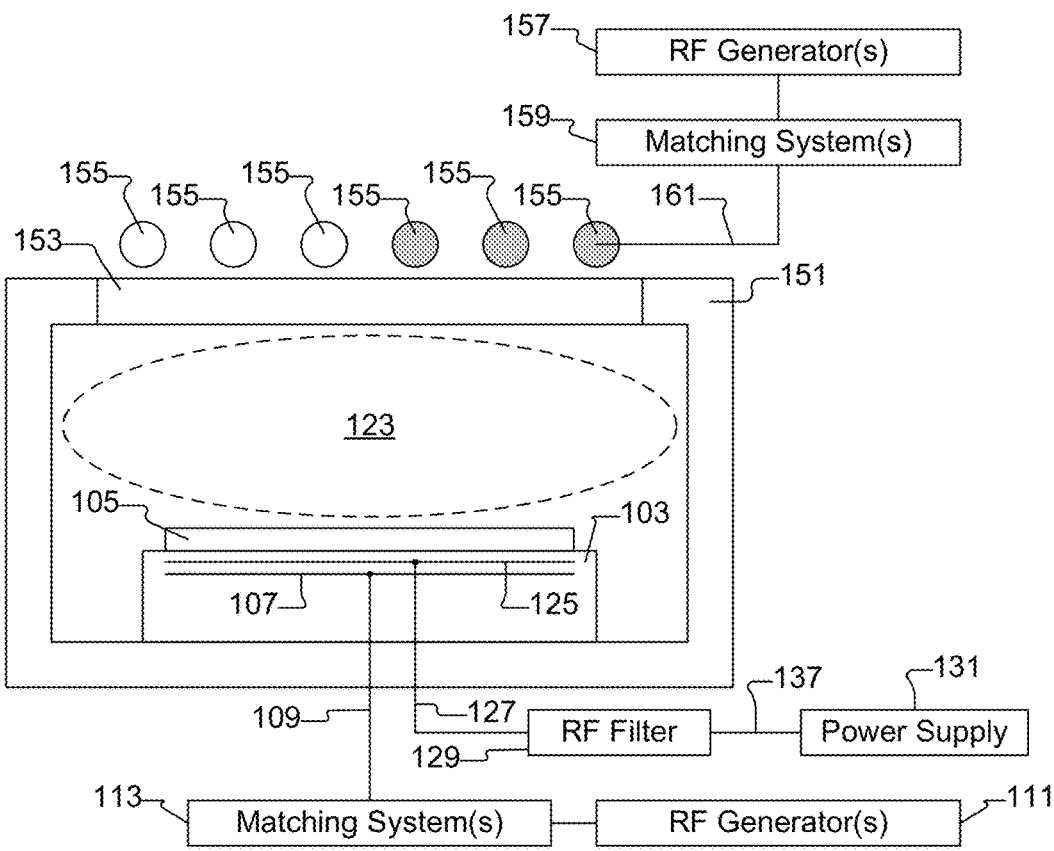
FIG. 1B shows an example vertical cross-section diagram of an ICP processing chamber, in accordance with some embodiments of the present disclosure.
Figure 1C:
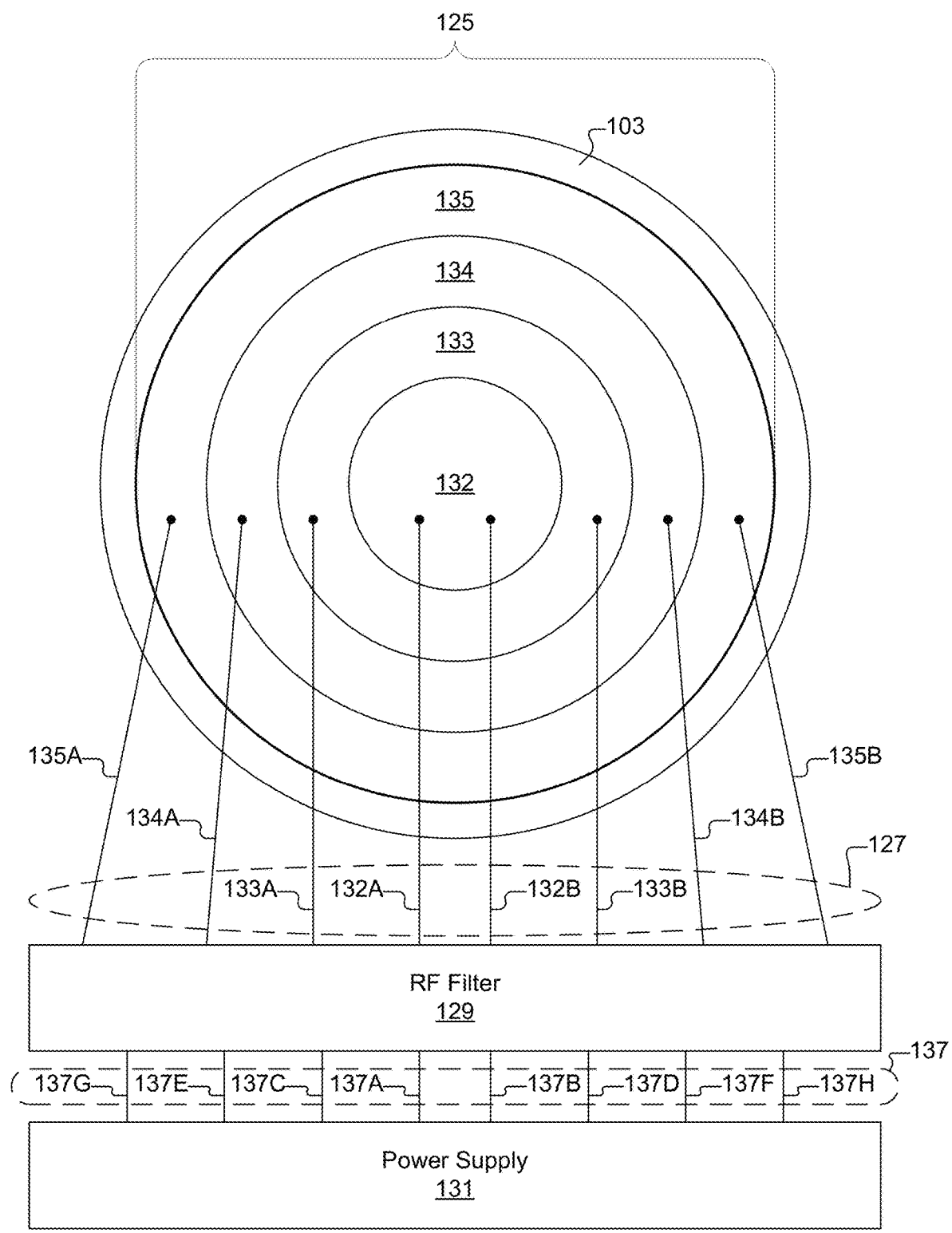
FIG. 1C shows a top view of an example heater assembly that includes four concentrically configured and positioned heating elements, in accordance with some embodiments of the present disclosure.

FIG. 1B shows an example vertical cross-section diagram of an ICP processing chamber 151, in accordance with some embodiments of the present disclosure. The ICP processing chamber can also be referred to as a transformer coupled plasma (TCP) processing chamber. For ease of discussion herein, ICP processing chamber will be used to refer to both ICP and TCP processing chambers. The ICP processing chamber 151 defines a processing volume within which the plasma 123 is generated in exposure to the substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material present on the substrate 105.

It should be understood that the ICP processing chamber 150 can be any type of ICP processing chamber in which RF power is transmitted from a coil 155 disposed outside the ICP processing chamber 151 to a process gas within the ICP processing chamber 151 to generate the plasma 123 within the ICP processing chamber 151. An upper window structure 153 is provided to allow for transmission of RF power from the coil 155 through the upper window structure 153 and into the processing volume of the ICP processing chamber 151. The ICP processing chamber 150 operates by flowing one or more process gases into the processing volume, and by applying RF power from the coil 155 to the one or more process gases to transform the one or more process gases into the plasma 123 in exposure to the substrate 105, in order to affect a change in material or surface condition on the substrate 105. The coil 155 is disposed above the upper window structure 153. In the example of FIG. 1B, the coil 155 is formed as a radial coil assembly, with the shaded parts of the coil 155 turning into the page of the drawing and with the unshaded parts of the coil 155 turning out of the page of the drawing. It should be understood, however, that in other embodiments the coil 155 can have essentially any configuration that is suitable for transmitting RF power through the upper window structure 153 and into the plasma processing volume. In various embodiments, the coil 155 can have any number of turns and any cross-section size and shape (circular, oval, rectangular, trapezoidal, etc.) as appropriate to provide the desired transmission of RF power through the upper window structure 153 into the processing volume.

The coil 155 is connected through a RF power supply structure 161 to one or more RF power generator(s) 157 by way of one or more impedance matching system(s) 159. The impedance matching system(s) 159 includes an arrangement of capacitors and/or inductors configured to ensure that an impedance seen by the RF power generator(s) 157 at the input of the impedance matching system(s) 159 is sufficiently close to an output impedance for which the RF power generator(s) 157 is designed to operate (usually 50 Ohms), so that RF power supplied to the coil 155 by the RF power generator(s) 157 will be transmitted into the processing volume in an efficient manner, i.e., without unacceptable or undesirable reflection. Also, in some embodiments, the ICP processing chamber 151 can include the electrode 107, the RF feed structure 109, the impedance matching system(s) 113, and the RF power generator(s) 111, as previously described with regard to FIG. 1A.

Also, in some embodiments, the ICP processing chamber 151 can include the heater assembly 125 disposed within the substrate support structure 103 to provide temperature control of the substrate 105. As described with regard to the CCP processing chamber 101 of FIG. 1A, the heater assembly 125 of the ICP processing chamber 151 is electrically connected to receive electrical power through the electrical connection 127, where the electrical power is supplied from the power supply 131 through the electrical connection 137 to the RF filter 129, and through the RF filter 129 to the electrical connection 127.

Figure 2:
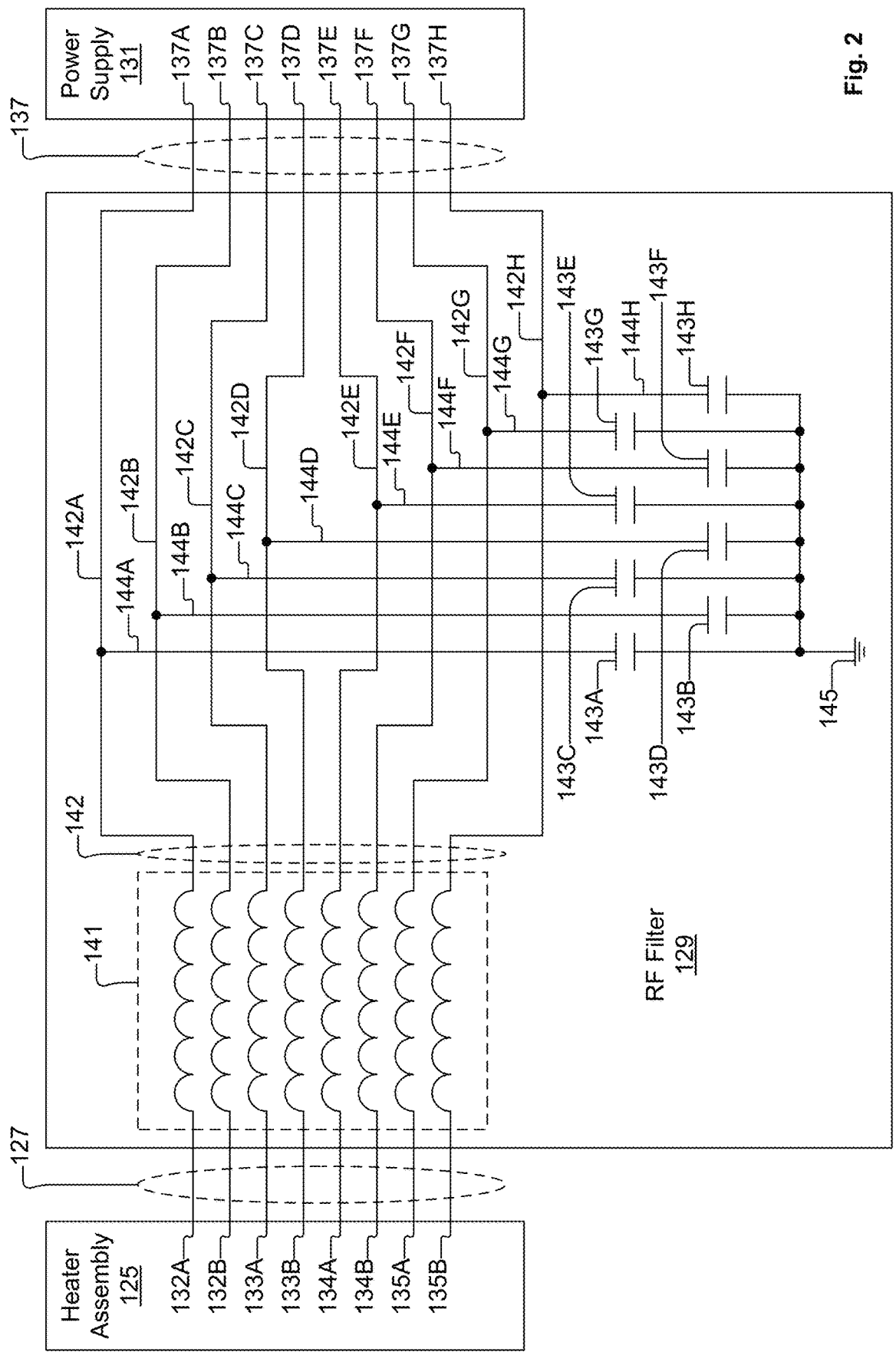
FIG. 2 shows an electrical schematic of the RF filter connected between the power supply and the heater assembly for the example embodiment of FIG. 1C, in accordance with some embodiments of the present disclosure.

FIG. 2 shows an electrical schematic of the RF filter 129 connected between the power supply 131 and the heater assembly 125 for the example embodiment of FIG. 1C, in accordance with some embodiments of the present disclosure. The RF filter 129 includes a separate wire for each wire that is connected between the power supply 131 and the heater assembly 125. Specifically, the RF filter 129 includes a wire 142A connecting the wire 137A from the output of the power supply 131 to the wire 132A that connects to the input to the heater assembly 125. The RF filter 129 also includes a wire 142B connecting the wire 137B from the output of the power supply 131 to the wire 132B that connects to the input to the heater assembly 125. The RF filter 129 also includes a wire 142C connecting the wire 137C from the output of the power supply 131 to the wire 133A that connects to the input to the heater assembly 125. The RF filter 129 also includes a wire 142D connecting the wire 137D from the output of the power supply 131 to the wire 133B that connects to the input to the heater assembly 125. The RF filter 129 also includes a wire 142E connecting the wire 137E from the output of the power supply 131 to the wire 134A that connects to the input to the heater assembly 125. The RF filter 129 also includes a wire 142F connecting the wire 137F from the output of the power supply 131 to the wire 134B that connects to the input to the heater assembly 125. The RF filter 129 also includes a wire 142G connecting the wire 137G from the output of the power supply 131 to the wire 135A that connects to the input to the heater assembly 125. The RF filter 129 also includes a wire 142H connecting the wire 137H from the output of the power supply 131 to the wire 135B that connects to the input to the heater assembly 125.

Each of the wires 142A, 142B, 142C, 142D, 142E, 142F, 142G, 142H (142A-142H) extends through and forms part of an inductor 141 within the RF filter 129. At a first end of the inductor 141, each of the wires 142A-142H is connected to the heater assembly 125 through the electrical connection 127. At a second end of the inductor 141, each of the wires 142A-142H is connected to the power supply 131 through the electrical connection 137. Within the inductor 141, the wires 142A-142H are twisted together to form a cable of twisted magnetic wires 142 that can be manipulated mechanically/spatially as a single cable. Within the inductor 141, the cable of twisted magnetic wires 142 is formed into a helical coil shape extending between the first end of the inductor 141 (at the electrical connection 127 to the heater assembly 125) and the second end of the inductor 141 (at the electrical connection 137 to the power supply 131). Each of the wires 142A-142H is formed as an electrical conductor coated with an electrical insulating coating material. Therefore, when the wires 142A-142H are twisted together to form the cable of twisted magnetic wires 142, the electrical insulating coating material of each wire 142A-142H prevents wire-to-wire conduction of low frequency electrical current, such as direct current (DC) and alternating current (AC) associated with electrical power transmission. Also, in some embodiments, the electrical insulating coating material of each wire 142A-142H is semi-transparent to RF power that may be traveling along the wires 142A-142H. In these embodiments, RF power can travel along the cable of twisted magnetic wires 142 as if it were a monolithic conductor cable, while low frequency (DC/AC) electrical current that simultaneously flows through the wires 142A-142H is prevented from flowing between the wires 142A-142H within the cable of twisted magnetic wires 142. This provides for reduction, or even elimination, of channel-to-channel variability in impedance of the RF filter 129, where a given channel corresponds to a given pair of the wires 142A-142H that provide electrical current flow to a given heating element 132, 133, 134, 135 within the heater assembly 125. In some embodiments, the wires 142A-142H are copper wires coated with a high-temperature electrical insulating polymer material. However, it should be understood that in various embodiments, the wires 142A-142H can be formed of an electrical conductor material other than copper, and can be coated with an electrical insulating coating material other than the high-temperature electrical insulating polymer material.

Each of the wires 142A-142H is electrically connected to a respective terminating capacitor 143A, 143B, 143C, 143D, 143E, 143F, 143G, 143H (143A-143H) at a respective location between the inductor 141 and the electrical connection 137 to the power supply 131. Specifically, the wire 142A is electrically connected to a first terminal of the terminating capacitor 143A through a wire 144A, and a second terminal of the terminating capacitor 143A is electrically connected to a reference ground potential 145. The wire 142B is electrically connected to a first terminal of the terminating capacitor 143B through a wire 144B, and a second terminal of the terminating capacitor 143B is electrically connected to the reference ground potential 145. The wire 142C is electrically connected to a first terminal of the terminating capacitor 143C through a wire 144C, and a second terminal of the terminating capacitor 143C is electrically connected to the reference ground potential 145. The wire 142D is electrically connected to a first terminal of the terminating capacitor 143D through a wire 144D, and a second terminal of the terminating capacitor 143D is electrically connected to the reference ground potential 145. The wire 142E is electrically connected to a first terminal of the terminating capacitor 143E through a wire 144E, and a second terminal of the terminating capacitor 143E is electrically connected to the reference ground potential 145. The wire 142F is electrically connected to a first terminal of the terminating capacitor 143F through a wire 144F, and a second terminal of the terminating capacitor 143F is electrically connected to the reference ground potential 145. The wire 142G is electrically connected to a first terminal of the terminating capacitor 143G through a wire 144G, and a second terminal of the terminating capacitor 143G is electrically connected to the reference ground potential 145. The wire 142H is electrically connected to a first terminal of the terminating capacitor 143H through a wire 144H, and a second terminal of the terminating capacitor 143H is electrically connected to the reference ground potential 145. Between the electrical connection 137 to the power supply 131 and the inductor 141, the wires 142A-142H and the wires 144A-144H and the terminating capacitors 143A-143H and the reference ground potential 145 can be collectively referred to an input arrangement of the RF filter 129.

The terminating capacitors 143A-143H have sufficiently high capacitance to ensure that their presence in combination with the inductor 141 cause RF power that enters the RF filter 129 from the heater assembly 125 to follow a transmission path to the reference ground potential 145 and not into the power supply 131. In some embodiments, each of the terminating capacitors 143A-143H has a capacitance within a range extending from about 3000 picoFarad (pF) to about 5000 pF, or of about 0.1 microFarad (μF). Also, because the terminating capacitors 143A-143H have such a large capacitance, manufacturing variability of the terminating capacitors 143A-143H has essentially no effect on the channel-to-channel impedance uniformity. Therefore, manufacturing variability of the terminating capacitors 143A-

143H has essentially no effect on overall unit-to-unit (RF filter 129-to-RF filter 129) impedance uniformity.

Figure 3A:
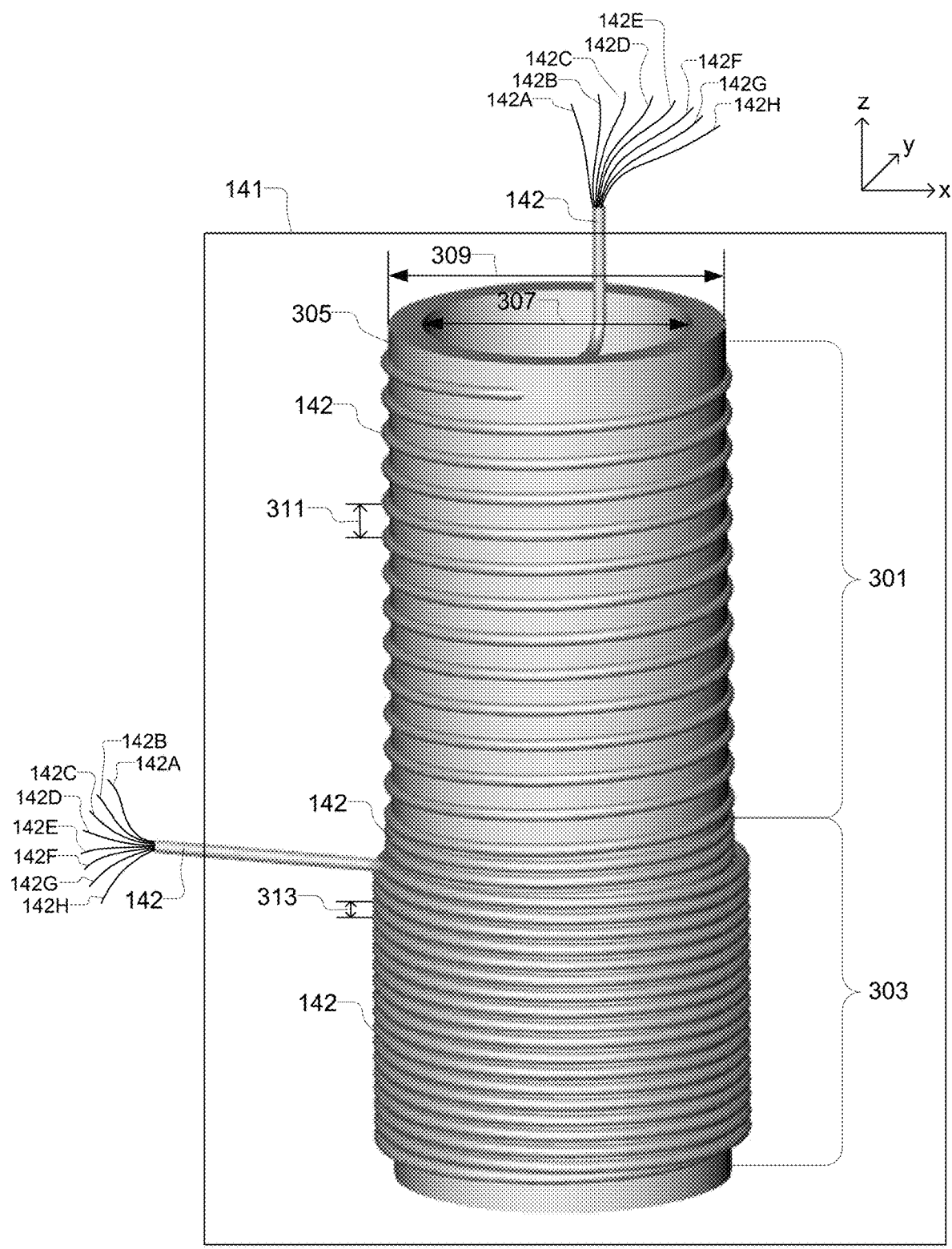
FIG. 3A shows an isometric view of the inductor, in accordance with some embodiments of the present disclosure.

FIG. 3A shows an isometric view of the inductor 141, in accordance with some embodiments of the present disclosure. The example inductor 141 of FIG. 3A is configured for use with the example heater assembly 125 FIG. 1C to filter RF power of two different RF frequencies. The inductor 141 includes a coil form 305 formed of an electrically insulating material. In some embodiments, the electrically insulating material of the coil form 305 is a polymer material that can withstand high temperatures. For example, in some embodiments, the electrically insulating material of the coil form 305 is a fluoropolymer of tetrafluoroethylene, such as polytetrafluoroethylene (PTFE), e.g., Teflon™. However, it should be understood that in other embodiments the electrically insulating material of the coil form 305 can be essentially any other solid material that is electrically non-conductive and that can withstand the operating temperature of the cable of twisted magnetic wires 142 and that is chemically compatible with the cable of twisted magnetic wires 142 and other interfacing materials when installed for operation with a plasma processing chamber. For example, in some embodiments, the electrically insulating material of the coil form 305 can be one or more of acrylonitrile butadiene styrene (ABS), acetate, acrylic, beryllium oxide, ceramic, Delrin™, epoxy, fiberglass, glass, Kynar™, Lexan™, Merlon™, melamine, mica, Nomex™, nylon, polyethylene terephthalate (PET), phenolics, polyester, polyolefins, polystyrene, polyurethane, polyvinylchloride (PVC), thermoplastics, polysulfone, polyetherimide, polyamide-imide, polyphenylene, Noryl™, Ultem™, UdeI™, Vespel™, TorIon™, vinyl, among others.

The example coil form 305 of FIG. 3A is formed as a hollow cylinder having an inner diameter 307 and an outer diameter 309. It should be understood that because the cable of twisted magnetic wires 142 is wrapped around the outer surface of the coil form 305, the inductance of the inductor 141 is a partial function of the outer diameter 309 of the coil form 305. In various embodiments, the outer diameter 309 of the coil form 305 is within a range extending from about 4 inches to about 6 inches.

In some embodiments, the inner diameter 307 of the coil form 305 is defined to provide for cooling air flow through the coil form 305. Also, the inner diameter 307 of the coil form 305 is defined to ensure that the coil form 305 has sufficient mechanical strength to provide a rigid structure for maintaining a spatial configuration of the coiled cable of twisted magnetic wires 142 on the outer surface of the coil form 305. Also, the inner diameter 307 of the coil form 305 can be defined to reduce an overall weight of the inductor 141, which can benefit physical mounting of the inductor 141. In various embodiments, the inner diameter 307 of the coil form 305 is within a range extending from about 3 inches to about 5 inches.

Generally speaking, the inductor 141 includes a number of coil sections corresponding to a number of substantially different RF frequencies that are to be filtered by the RF filter 129. In the example of FIG. 3A, the inductor 141 is configured to filter RF power of two substantially different RF frequencies. Therefore, the example inductor 141 of FIG. 3A has two coil sections, namely a first coil section 301 and a second coil section 303. Each coil section, e.g., 301, 303, of the inductor 141 extends along a respective portion of an overall axial length of the inductor 141. In the example of FIG. 3A, the overall axial length of the inductor 141 is measured in the z-direction, with the inner diameter 307 and the outer diameter 309 measured in the x-y plane. Each coil section, e.g., 301, 303, of the inductor 141 is configured to have particular inductance characteristics defined for filtering RF power at or near a particular RF frequency that is intended to be filtered by the RF filter 129.

The particular inductance provided by a given coil section, e.g., 301, 303, of the inductor 141 is a function of the outer diameter 309 of the coil form 305, the axial length of the given coil section, the turn pitch between adjacent turns (around the coil form 305) of the cable of twisted magnetic wires 142 within the given coil section, and the number of turns (around the coil form 305) of the cable of twisted magnetic wires 142 within the given coil section. In the example of FIG. 3A, the first coil section 301 has a turn pitch 311 measured between adjacent turns of the cable of twisted magnetic wires 142, and the second coil section 303 has a turn pitch 313 measured between adjacent turns of the cable of twisted magnetic wires 142. It should be understood that the turn pitch is measured parallel to the z-direction between the centerline of the cable of twisted magnetic wires 142 on adjacent turns of the cable of twisted magnetic wires 142 around the coil form 305 and at a same azimuthal location about the z-direction axis of the coil form 305. The turn pitch, e.g., 311, 313, between adjacent turns of the cable of twisted magnetic wires 142 in a given coil section, e.g., 301, 303, affects the resonant frequency of the given coil section. In other words, the turn pitch, e.g., 311, 313, between adjacent turns of the cable of twisted magnetic wires 142 in a given coil section determines the RF frequency that will be filtered by the given coil section. A smaller turn pitch, e.g., 311, 313, between adjacent turns of the cable of twisted magnetic wires 142 in a given coil section, e.g., 301, 303, provides a higher inductance in the given coil section. And, a larger turn pitch, e.g., 311, 313, between adjacent turns of the cable of twisted magnetic wires 142 in a given coil section, e.g., 301, 303, provides a lower inductance in the given coil section.

To obtain a particular impedance for a given coil section, e.g., 301, 303, less inductance is needed within the given coil section for higher RF frequency, and more inductance is needed within the given coil section for lower RF frequency. Therefore, to obtain a particular impedance for a given coil section, e.g., 301, 303, for higher RF frequency, less inductance is needed within the given coil section, which corresponds to a larger turn pitch, e.g., 311, 313, between adjacent turns of the cable of twisted magnetic wires 142 in the given coil section, e.g., 301, 303. And, to obtain a particular impedance for a given coil section, e.g., 301, 303, for lower RF frequency, more inductance is needed within the given coil section, which corresponds to a smaller turn pitch, e.g., 311, 313, between adjacent turns of the cable of twisted magnetic wires 142 in the given coil section, e.g., 301, 303. Therefore, in the example inductor 141 of FIG. 3A, the first coil section 301 having the larger turn pitch 311 between adjacent turns of the cable of twisted magnetic wires 142 provides lower inductance and is resonant with the higher RF frequency. And, in the example inductor 141 of FIG. 3A, the second coil section 303 having the smaller turn pitch 313 between adjacent turns of the cable of twisted magnetic wires 142 provides higher inductance and is resonant with the lower RF frequency. It should be understood that the cable of twisted magnetic wires 142 is continuous through an entirety of the inductor 141 from the first end of the inductor 141 that is connected to the heater assembly 125 to the second end of the inductor 141 that is connected to the power supply 131. Therefore, at each transition between adjacent coil sections, e.g., 301, 303, the cable of twisted magnetic wires 142 is wrapped around the coil form 305 without discontinuity and with an adjustment in the turn pitch between adjacent turns of the cable of twisted magnetic wires 142.

Figure 3B:
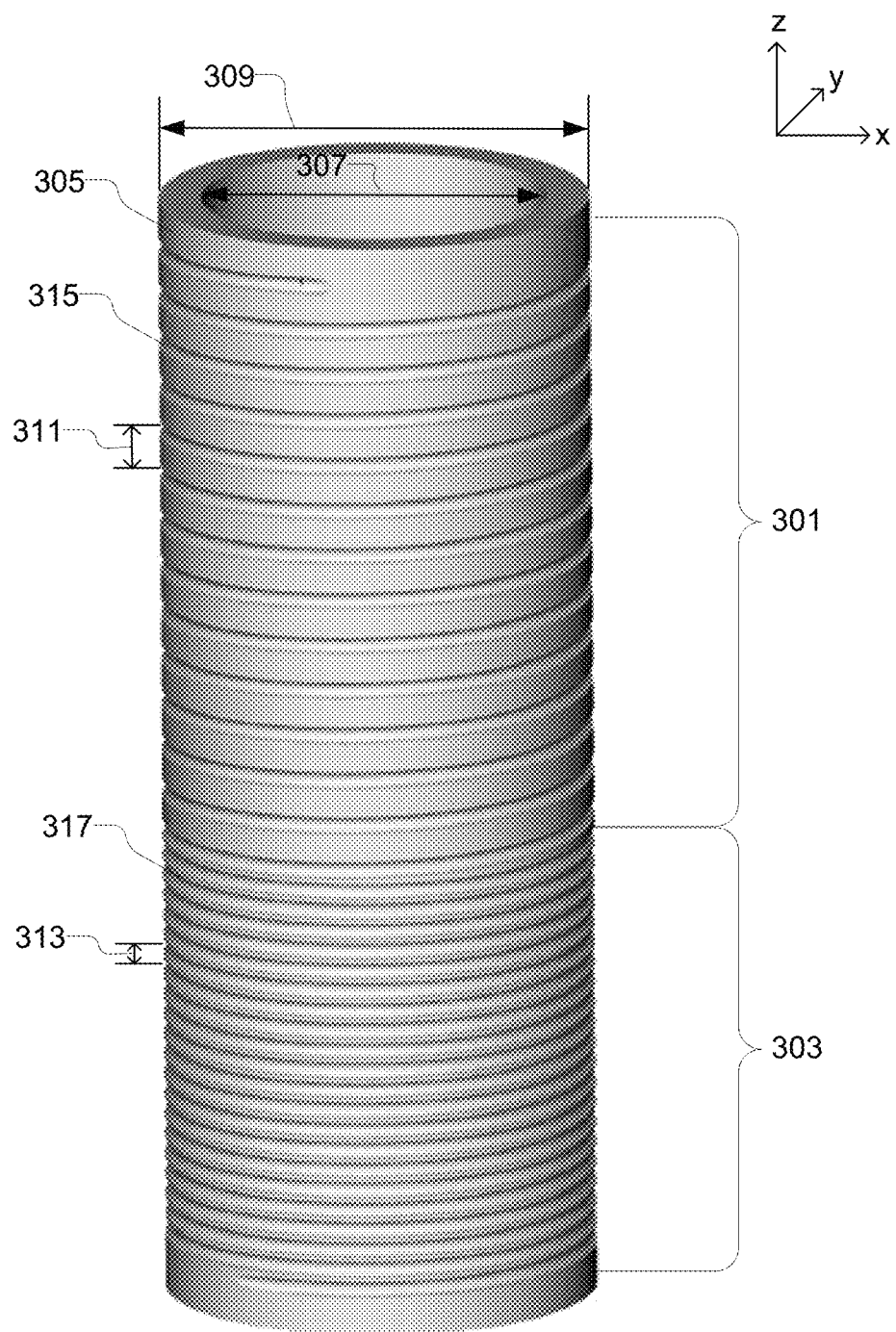
FIG. 3B shows the coil form in a bare state, in accordance with some embodiments of the present disclosure.
Figure 3C:
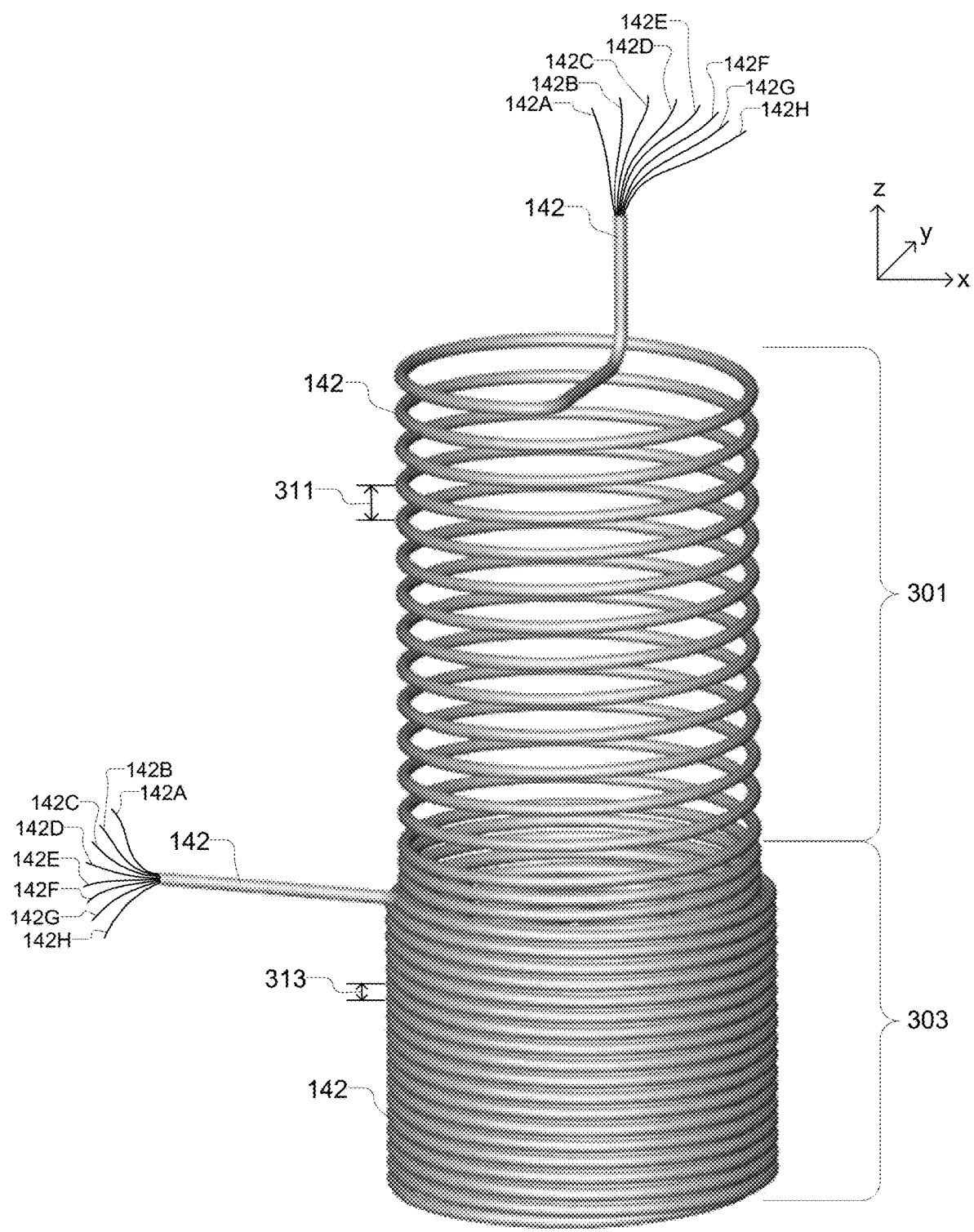
FIG. 3C shows an undivided coil of the cable of twisted magnetic wires that is formed by wrapping the cable of twisted magnetic wires around the coil form, in accordance with some embodiments of the present disclosure.

FIG. 3B shows the coil form 305 in a bare state, in accordance with some embodiments of the present disclosure. FIG. 3C shows an undivided coil of the cable of twisted magnetic wires 142 that is formed by wrapping the cable of twisted magnetic wires 142 around the coil form 305, in accordance with some embodiments of the present disclosure. In the example of FIG. 3B, a continuous groove is formed in the outer surface of the coil form 305 to provide for accurate positioning of the cable of twisted magnetic wires 142 around the coil form 305 and to provide for preservation of the spatial configuration of the undivided coil of the cable of twisted magnetic wires 142 that is formed by wrapping the cable of twisted magnetic wires 142 around the coil form 305. FIG. 3B shows that the continuous groove includes a first groove portion 315 formed within the first coil section 301 and a second groove portion 317 formed within the second coil section 303, with a smooth transition between the first groove portion 315 and the second groove portion 317 at the transition between the first coil section 301 and the second coil section 303. It should be understood, however, that in other embodiments, the coil form 305 can be configured without the continuous groove in its outer surface. For example, in some embodiments, the coil form 305 can have a substantially smooth outer surface with electrically insulating spacers used to separate adjacent turns of the cable of twisted magnetic wires 142 around the coil form 305. In these embodiments, the electrically insulating spacers can be formed of essentially any material available for use in forming the coil form 305, such as those listed above, by way of example.

It should be understood that although the example coil form 305 is shown to have an outer surface of right-circular-cylindrical shape (excluding the presence of the continuous groove), in other embodiments, the outer surface of the coil form 305 can have other cross-sectional shapes within the x-y plane, such as an oval shape, a rectangular shape, a square shape, a triangular shape, a polygonal shape, a star shape, an x-shape, a cross shape, among other shapes. Also, in some embodiments, the cross-sectional shape and/or size of the outer surface of the coil form 305 within the x-y plane can vary/change along the axial length of the coil form 305. For example, the cross-sectional shape and/or size of the outer surface of the coil form 305 within the x-y plane can vary/change for different coil sections, e.g., 301, 303. For example, in some embodiments, the coil form 305 can be configured to have a first value of the outer diameter 309 for the first coil section 301 and a second value of the outer diameter 309 for the second coil section 303, where the second value of the outer diameter 309 is different than the first value of the outer diameter 309. Also, it should be understood that in some embodiments the coil form 305 of the inductor 141 can have a solid configuration without a hollow interior region.

Figure 3D:
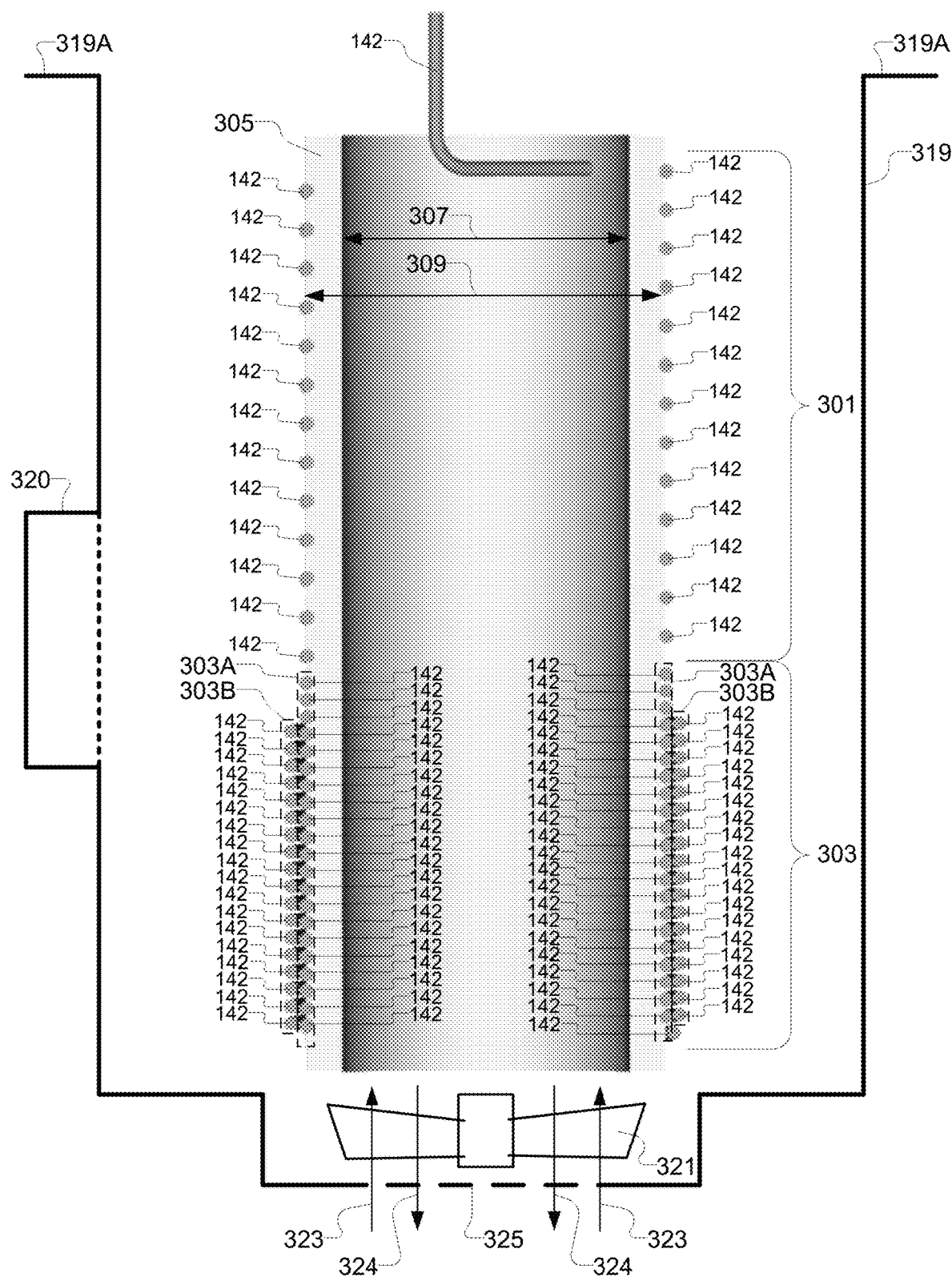
FIG. 3D shows a vertical cross-section through a center of the inductor, in accordance with some embodiments of the present disclosure.

Additionally, each coil section, e.g., 301, 303, of the inductor 141 can include one or more turn layers of the cable of twisted magnetic wires 142. For example, in the inductor 141, as shown in FIG. 3A, the first coil section 301 has one turn layer of the cable of twisted magnetic wires 142, and the second coil section 303 has two turn layers of the cable of twisted magnetic wires 142. FIG. 3D shows a vertical cross-section through a center of the inductor 141, in accordance with some embodiments of the present disclosure. FIG. 3D shows the various turns of the cable of twisted magnetic wires 142 around the coil form 305. FIG. 3D shows the first coil section 301 having the one turn layer of the cable of twisted magnetic wires 142. FIG. 3D also shows the second coil section 303 having the two turn layers of the cable of twisted magnetic wires 142. Specifically, the second coil section 303 has a first turn layer 303A of the cable of twisted magnetic wires 142 formed on the outer surface of the coil form 305, and a second turn layer 303B of the cable of twisted magnetic wires 142 formed outside/over the first turn layer 303A of the cable of twisted magnetic wires 142. It should be appreciated and understood that in various embodiments, any coil section, e.g., 301, 303, of the inductor 141 can be configured to include one or more turn layers of the cable of twisted magnetic wires 142 as appropriate to provide a desired level of inductance. Also, it should be understood that having multiple turn layers of the cable of twisted magnetic wires 142 in a given coil section, e.g., 301, 303, provides for reduction in an overall size of the inductor 141, and provides for a higher inductance with the given coil section as compared to having the same total length of the cable of twisted magnetic wires 142 in the given coil section wound in a single turn layer.

In an example embodiment, the inductor 141 is configured to filter RF frequencies at or about 1 MHz and at or about 13.56 MHz. In this example embodiment, the first coil section 301 having the larger turn pitch 311 between adjacent turns of the cable of twisted magnetic wires 142 is configured to filter the higher RF frequency of 13.56 MHz. And, the second coil section 303 having the smaller turn pitch 313 between adjacent turns of the cable of twisted magnetic wires 142 is configured to filter the lower RF frequency of 1 MHz. In this example embodiment, the first coil section 301 includes 13 turns of the cable of twisted magnetic wires 142. Also, in this embodiment, the first turn layer 303A of the second coil section 303 includes 21 turns of the cable of twisted magnetic wires 142. And, in this embodiment, the second turn layer 303B of the second coil section 303 includes 18 turns of the cable of twisted magnetic wires 142. Additionally, in this example embodiment, each of the terminating capacitors 143A-143H has a capacitance value of about 0.1 microFarad.

It should be appreciated that the inductor 141 can be configured for filtering two or more different RF frequencies, and that the 1 MHz and 13.56 MHz frequencies in the example embodiment above are mentioned by way of example. For instance, if the inductor 141 were to be configured for filtering three different RF frequencies, such as 400 kiloHertz (kHz), 1 MHz, and 13.56 MHz, by way of example, the inductor 141 would include three coil sections, such as coil sections 301, 303, and another coil section extending from coil section 303. Also, the turn pitch between adjacent turns of the cable of twisted magnetic wires 142 can be different in each of the three coil sections, as appropriate to be resonant with the three different RF frequencies, respectively. And, the number of turns of the cable of twisted magnetic wires 142 in each of the three coil sections can be set as appropriate to establish a desired inductance in each of the three coil sections. And, as previously mentioned, in some embodiments, the outer diameter 309 of the coil form 305 can be different for one or more of the three coil sections if appropriate to obtain a desired inductance with that particular coil section.

In some embodiments, for the inductor 141 having the two coil sections 301 and 303, with the coil section 301 having the larger turn pitch 311 between adjacent turns of the cable of twisted magnetic wires 142, the number of turns within the coil section 301 is within a range extending from about 10 to about 15. Also, in this embodiment, the number of turns within the coil section 303 is within a range extending from about 20 to about 25. Also, in this embodiment, the turn pitch 311 between adjacent turns of the cable of twisted magnetic wires 142 within the coil section 301 is within a range extending from about 0.4 inch to about 0.6 inch. Also, in this embodiment, the turn pitch 313 between adjacent turns of the cable of twisted magnetic wires 142 within the coil section 303 is within a range extending from about 0.2 inch to about 0.3 inch.

FIG. 3D also shows how the inductor 141 can be disposed within an outer housing 319, where the outer housing 391 provides for physical protection of the inductor 141 and provides for fit-up of the inductor 141 with other equipment and/or equipment rack, chassis, box, housing, etc. associated with the plasma processing chamber. In some embodiments, the outer housing 319 is configured as a substantially cylindrical-shaped structure having a flange 319A on at least one end for mounting to another surface. Also, in some embodiments, the outer housing 319 can have an attached enclosure 320 for housing the terminating capacitors, e.g., 143A-143H, and connectors for receiving power from the power supply 131. However, it should be understood that in other embodiments, the outer housing 319 can be formed to have essentially any shape as appropriate to physically protect the inductor 141, to provide for cooling of the inductor 141, and to enable fit-up of the inductor 141 within existing systems associated with the plasma processing chamber. Also, FIG. 3D shows how a fan 321 can be disposed proximate to a grating 325 to either push cooling air through the inductor 141, as indicated by arrows 323, or draw cooling air through the inductor 141, as indicated by arrows 324.

During operation of the plasma processing chamber, e.g., 101, 151, the RF filter 129 appears as a load to the RF generator(s), e.g., 111, 121, 157. Therefore, if the impedance of the RF filter 129 is higher, the load presented by the RF filter 129 to the RF generator(s) is lower. Therefore, in some embodiments, it is of interest to have the RF filter 129 represent a high impedance to RF power transmission so that a lower amount of RF power will be lost within the RF filter 129. In some embodiments, the operating RF frequencies of the RF power generator(s), e.g., 111, 121, 157, can change as a result of frequency tuning. In these embodiments, it would be desirable to have the RF filter 129 provide at least a minimum specified impedance over the expected range of RF frequencies generated by the RF power generator(s) during frequency tuning operations. In some embodiments, the impedance of the RF filter 129 is about 3 kiloOhms or higher so as to bound the expected range of RF frequencies generated by the RF power generator(s) during frequency tuning operations. In this manner, the RF filter 129 is configured to present at least a minimum specified impedance for any RF frequency that will occur during operation. Also, it should be appreciated that because the impedance of the RF filter 129 is relatively high, e.g., 3 kiloOhms, less RF power will be transmitted through the RF filter 129, and the overall RF power efficiency of the plasma processing chamber, e.g., 101, 151, will be improved.

Figure 4:
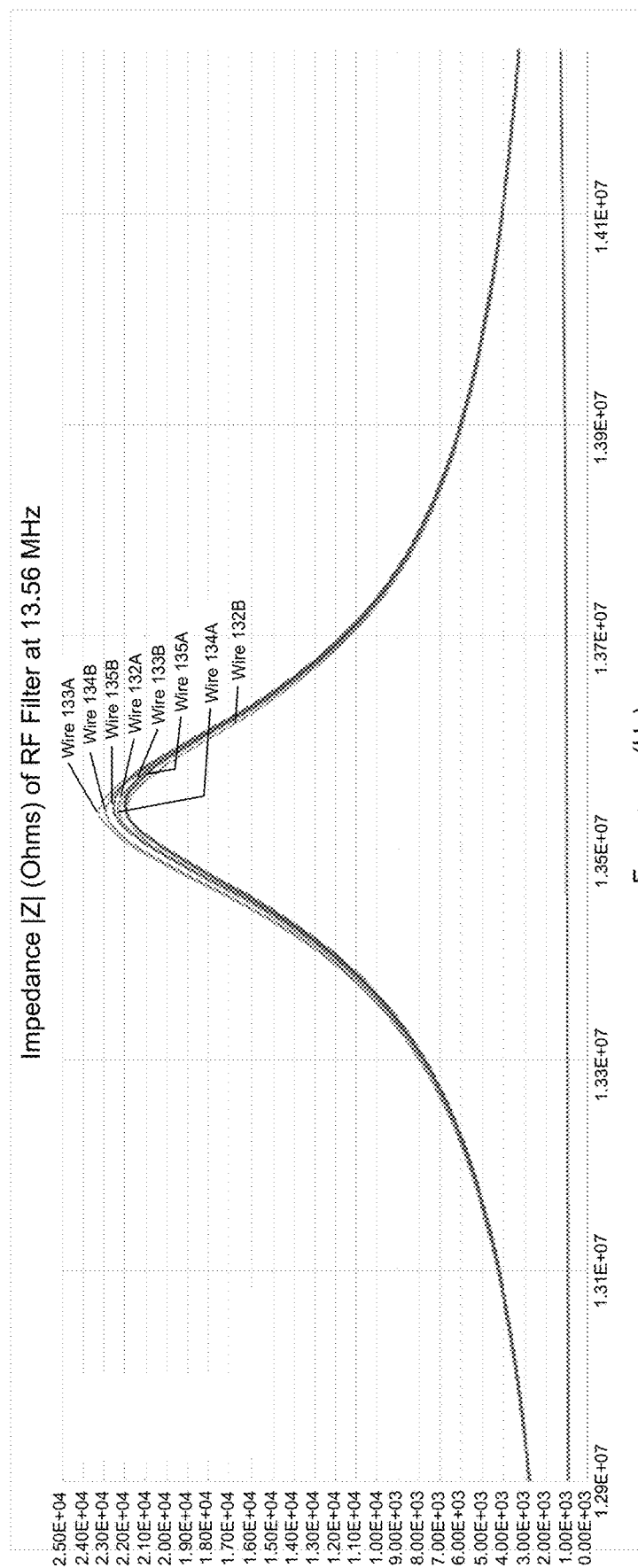
FIG. 4 shows plots of impedance as a function of RF frequency, about the higher primary RF frequency of 13.56 MHz, for each of the wires that provide electrical current flow to a given heating element within the heater assembly, in accordance with some embodiments of the present disclosure.
Figure 5:
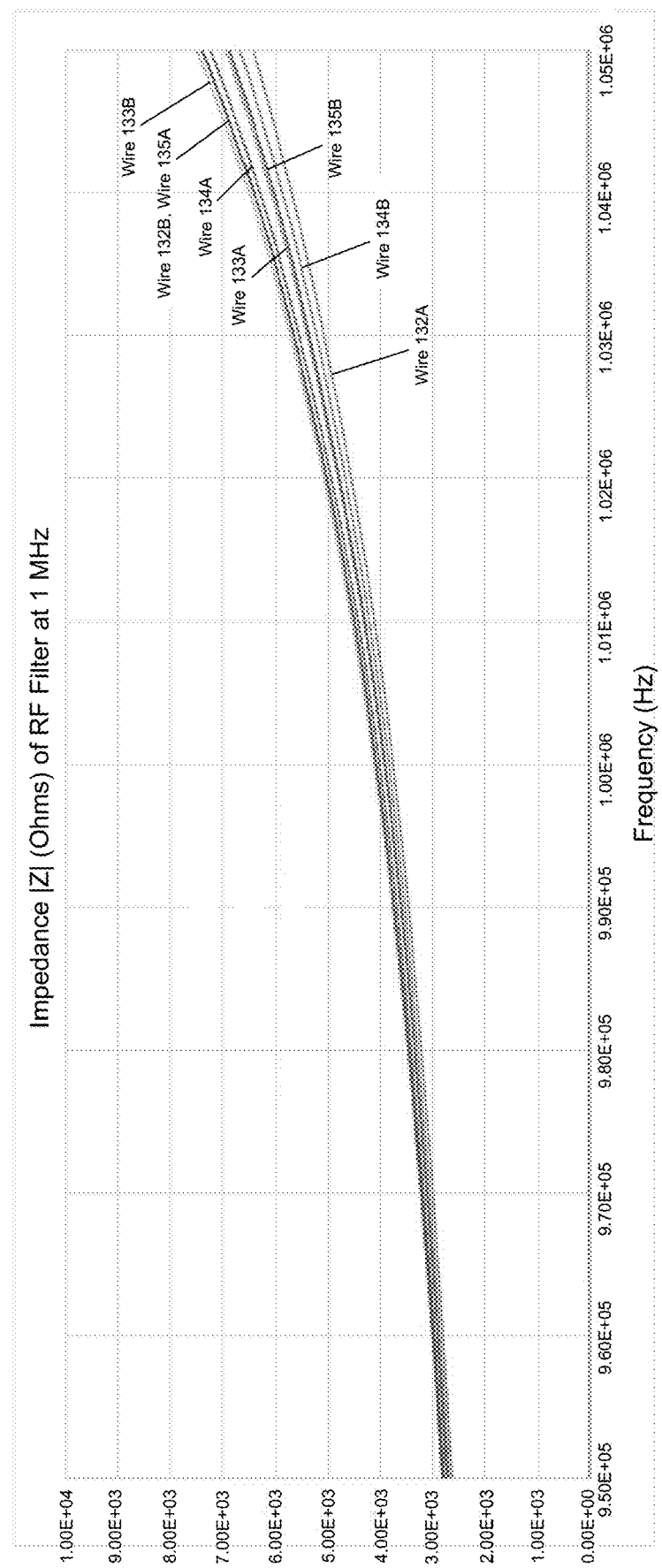
FIG. 5 shows plots of impedance as a function of RF frequency, about the lower primary RF frequency of 1 MHz, for each of the wires that provide electrical current flow to a given heating element within the heater assembly, in accordance with some embodiments of the present disclosure.

As previously mentioned, a given channel corresponds to a given pair of the wires 142A-142H that provide electrical current flow to a given heating element 132, 133, 134, 135 within the heater assembly 125. The RF filter 129 provides for improved channel-to-channel impedance uniformity because the RF filter 129 is capable of blocking RF power transmission in a substantially similar manner for each channel that is present. FIG. 4 shows plots of impedance as a function of RF frequency, about the higher primary RF frequency of 13.56 MHz, for each of the wires 132A, 132B, 132C, 132D, 132E, 132F, 132G, 132H that provide electrical current flow to a given heating element 132, 133, 134, 135 within the heater assembly 125, in accordance with some embodiments of the present disclosure. FIG. 4 demonstrates how the RF filter 129 provides substantial uniformity in channel-to-channel impedance for RF frequencies at or near the higher RF frequency of 13.56 MHz. FIG. 5 shows plots of impedance as a function of RF frequency, about the lower primary RF frequency of 1 MHz, for each of the wires 132A, 132B, 132C, 132D, 132E, 132F, 132G, 132H that provide electrical current flow to a given heating element 132, 133, 134, 135 within the heater assembly 125, in accordance with some embodiments of the present disclosure. FIG. 5 demonstrates how the RF filter 129 provides substantial uniformity in channel-to-channel impedance for RF frequencies at or near the lower RF frequency of 1 MHz. Because the RF filter 129 provides substantial uniformity in channel-to-channel impedance, essentially the same amount of RF power will be present on each of the power supply channels for the heater assembly 125, which means that the different heating elements, e.g., 132, 133, 134, 135, of the various heating zones will have a substantially uniform effect on RF power transmission within the respective heating zones, thereby improving process uniformity across the substrate 105 with regard to RF power transmission/loss through the different heating elements, e.g., 132, 133, 134, 135. Also, by controlling the channel-to-channel impedance uniformity within the RF filter 129, it is possible to control the impedance uniformity between different RF filter 129 units installed on different plasma processing chambers, and therefore control the impact of the RF filter 129 on chamber-to-chamber impedance uniformity.

It should be understood that an RF filter (e.g., 129) is disclosed herein to include an inductive element (such as inductor 141, by way of example) and a set of terminating capacitive elements (such as capacitors 143A-143H, by way of example). The inductive element (e.g., 141) includes at least two coil sections (e.g., 301, 303) collectively forming an undivided coil of a cable of twisted magnetic wires (e.g., 142). The undivided coil of the cable of twisted magnetic wires (e.g., 142) has a continuous configuration through each transition between adjacent ones of the at least two coil sections (e.g., 301, 303). Each coil section (e.g., 301, 303) includes a portion of the undivided coil of the cable of twisted magnetic wires (e.g., 142) configured at a corresponding turn pitch (e.g., 311, 313). At least two adjacent coil sections (e.g., 301, 303) have different turn pitches (e.g., 311, 313). The cable of twisted magnetic wires (e.g., 142) includes two wires per channel and is configured for at least one channel. The cable of twisted magnetic wires (e.g., 142) at a first end of the inductive element (e.g., 141) is configured for connection to an electrical component (e.g., 125) that is to receive power from a power supply (e.g., 131). The cable of twisted magnetic wires (e.g., 142) at a second end of the inductive element (e.g., 141) is configured for connection to the power supply (e.g., 131). The set of terminating capacitive elements (e.g., 143A-143H) includes a separate terminating capacitive element for each wire of the cable of twisted magnetic wires (e.g., 142). Each terminating capacitive element (e.g., 143A-143H) is electrically connected between a reference ground potential (e.g., 145) and a respective wire of the cable of twisted magnetic wires (e.g., 142) at a location between the second end of the inductive element (e.g., 141) and the power supply (e.g., 131).

In some embodiments, a number of the at least two coil sections (e.g., 301, 303) corresponds to a number of different RF frequencies to be filtered by the RF filter (e.g., 129). Also, in some embodiments, the turn pitch (e.g., 311, 313) of a given coil section (e.g., 301, 303) is set to make the given coil section (e.g., 301, 303) resonant with one of the number of different RF frequencies to be filtered by the RF filter (e.g., 129). In some embodiments, each wire (e.g., 142A-142H) of the cable of twisted magnetic wires (e.g., 142) is an electrical conductor coated with an electrical insulating coating material. In some embodiments, the electrical insulating coating material prevents wire-to-wire conduction of low frequency electrical current and allows wire-to-wire transmission of RF power. In some embodiments, the inductive element (e.g., 141) includes a coil form (e.g., 305) about which the undivided coil of the cable of twisted magnetic wires (e.g., 142) is wrapped. In some embodiments, the coil form (e.g., 305) is shaped as a hollow right-circular-cylinder. In some embodiments, a continuous groove is formed within an outer surface of the coil form (e.g., 305), where the continuous groove is configured to receive the cable of twisted magnetic wires (e.g., 142) and preserve a spatial configuration of the undivided coil of the cable of twisted magnetic wires (e.g., 142).

In some embodiments, at least one coil section (e.g., 301, 303) includes a plurality of turn layers of the cable of twisted magnetic wires (e.g., 142). In some embodiments, the plurality of turn layers are stacked in a radial direction relative to an axis of the inductive element (e.g., 141). In some embodiments, at least two coil sections (e.g., 301, 303) have different lengths as measured along an axis of the inductive element (e.g., 141). In some embodiments, the undivided coil of the cable of twisted magnetic wires (e.g., 142) has a different turn diameter (e.g., 309) in at least two coil sections (e.g., 301, 303). In some embodiments, the undivided coil of the cable of twisted magnetic wires (e.g., 142) has a different turn shape in at least two coil sections (e.g., 301, 303). In some embodiments, the cable of twisted magnetic wires (e.g., 142) includes eight wires (e.g., 142A-142H) and is configured for four channels, and the number of the at least two coil sections (e.g., 301, 303) within the inductive element (e.g., 141) is two. In some embodiments, the undivided coil of the cable of twisted magnetic wires (e.g., 142) has a substantially same turn diameter (e.g., 309) in the two coil sections (e.g., 301, 303), and the turn pitch (e.g., 311) of a first coil section (e.g., 301) that connects to the first end of the inductive element (e.g., 141) is larger that the turn pitch (e.g., 313) of a second coil section (e.g., 303) that connects to the second end of the inductive element (e.g., 141). In some embodiments, the first coil section (e.g., 301) has a single turn layer of the cable of twisted magnetic wires (e.g., 142), and the second coil section (e.g., 303) has two turn layers (e.g., 303A, 303B) of the cable of twisted magnetic wires (e.g., 142). In some embodiments, the first coil section (e.g., 301) has about 13 turns of the cable of twisted magnetic wires (e.g., 142) within the single turn layer, and the second coil section (e.g., 303) has about 21 turns of the cable of twisted magnetic wires (e.g., 142) within an inner turn layer (e.g., 303A) of the two turn layers, and the second coil section (e.g., 303) has about 18 turns of the cable of twisted magnetic wires (e.g., 142) within an outer turn layer (e.g., 303B) of the two turn layers, and each terminating capacitive element (e.g., 143A-143H) in the set of terminating capacitive elements has a capacitance value of about 0.1 microFarad.

FIG. 6 presents a method for filtering RF power, in accordance with some embodiments of the present disclosure. The method includes connecting an RF filter (e.g., 129) between a power supply (e.g., 131) and an electrical component (e.g., 125) that is to receive power from the power supply (e.g., 131). In the method of FIG. 6, the RF filter (e.g., 129) includes an inductive element (e.g., 141) having at least two coil sections (e.g., 301, 303) collectively forming an undivided coil of a cable of twisted magnetic wires (e.g., 142). Each coil section (e.g., 301, 303) includes a portion of the undivided coil of the cable of twisted magnetic wires (e.g., 142) configured at a corresponding turn pitch (e.g., 311, 313). At least two adjacent coil sections (e.g., 301, 303) have different turn pitches (e.g., 311, 313). The cable of twisted magnetic wires (e.g., 142) includes two wires per channel and is configured for at least one channel. The cable of twisted magnetic wires (e.g., 142) at a first end of the inductive element (e.g., 141) is connected to the electrical component (e.g., 125). The cable of twisted magnetic wires (e.g., 142) at a second end of the inductive element (e.g., 141) is connected to the power supply (e.g., 131). The RF filter (e.g., 129) includes a separate terminating capacitive element (e.g., 143A-143H) for each wire (e.g., 142A-142H) of the cable of twisted magnetic wires (e.g., 142). Each terminating capacitive element (e.g., 143A-143H) is electrically connected between a reference ground potential (e.g., 145) and a respective wire (e.g., 142A-142H) of the cable of twisted magnetic wires (e.g., 142) at a location between the second end of the inductive element (e.g., 141) and the power supply (e.g., 131). In some embodiments, a number of the at least two coil sections (e.g., 301, 303) corresponds to a number of different RF frequencies to be filtered by the RF filter (e.g., 129). In some embodiments, the turn pitch (e.g., 311, 313) of a given coil section (e.g., 301, 303) is set to make the given coil section (e.g., 301, 303) resonant with one of the number of different RF frequencies to be filtered by the RF filter (e.g., 129). In some embodiments, each wire (e.g., 142A-142H) of the cable of twisted magnetic wires (e.g., 142) is an electrical conductor coated with an electrical insulating coating material that prevents wire-to-wire conduction of low frequency electrical current and allows wire-to-wire transmission of RF power.

FIG. 7 presents a method for filtering RF power, in accordance with some embodiments of the present disclosure. The method includes an operation 701 for transmitting electrical power from a power supply (e.g., 131) to wires (e.g., 142A-142H) within an input arrangement. The wires (e.g., 142A-142H) are connected to respective capacitive elements (e.g., 143A-143H). Each separate pair of the wires (e.g., 142A-142H) is designated to provide electrical power to an electrical component (e.g., 125) that is exposed to RF power. The method also includes an operation 703 for passing electrical power from the wires (e.g., 142A-142H) within the input arrangement to corresponding magnetic wires within a cable of twisted magnetic wires (e.g., 142), at an input of an inductive element (e.g., 141). The inductive element (e.g., 141) includes at least two coil sections (e.g., 301, 303) collectively forming an undivided coil of the cable of twisted magnetic wires (e.g., 142) between the input of the inductive element (e.g., 141) and an output of the inductive element (e.g., 141). Each coil section (e.g., 301, 303) includes a portion of the undivided coil of the cable of twisted magnetic wires (e.g., 142) configured at a corresponding turn pitch (e.g., 311, 313). At least two adjacent coil sections (e.g., 301, 303) have different turn pitches (e.g., 311, 313). The method also includes an operation 705 for passing electrical power from the magnetic wires within the cable of twisted magnetic wires (e.g., 142) at the output of the inductive element (e.g., 141) to corresponding wires (e.g., 132A, 132B, 133A, 133B, 134A, 134B, 135A, 135B) connected to the electrical component (e.g., 125) that is exposed to RF power.

To understand some of the advantages of the RF filter 129, it is beneficial to contrast the RF filter 129 with other possible RF filter configurations. For the purpose of filtering two or more different primary RF frequencies, some other possible RF filter configurations can implement physically separate inductors and terminating capacitor sets for each of the different primary RF frequencies. For example, in the case of two primary RF frequencies, the other possible RF filter configuration can implement one inductor and terminating capacitor set for the first primary RF frequency and also implement a physically separate inductor and terminating capacitor set for the second primary RF frequency. When compared with the RF filter 129, this other possible RF filter configuration has double the number of inductors and double the number of terminating capacitors. It should be understood and appreciated that the RF filter 129 differs from this other possible RF filter configuration in that the different coil sections, e.g., 301, 303, of the RF filter 129 are part of the same coil winding and are not physically separate inductors. Also, the RF filter 129 differs from this other possible RF filter configuration in that one set of terminating capacitors 143A-143H is used regardless of the number of different coil sections, e.g., 301, 303.

Additionally, in the other possible RF filter configuration, some terminating capacitors can have a relatively low capacitance value with a relatively high manufacturing tolerance on capacitance of a few percent or more. These manufacturing tolerances on capacitance of the terminating capacitors can combine to intrinsically limit the achievable channel-to-channel impedance uniformity within the other possible RF filter configuration. Also, in the other possible RF filter configuration, a separate inductor defined for filtering lower RF frequency can be configured (by necessity) to have a ferrite core around which non-twisted conductor wires are wound. The ferrite core in this other possible RF filter configuration can have a large unit-to-unit variation in permeability of up to 30%, which intrinsically limits the achievable uniformity in impedance between different RF filter units. Reduction of the unit-to-unit variation in permeability of the ferrite core material can be expensive and can require use of a larger ferrite core structure. With regard to the other possible RF filter configuration, the manufacturing variability in the capacitances of the smaller terminating capacitors and the manufacturing variability associated with the permeability of the ferrite core material for the lower frequency winding collectively cause an increase in chamber-to-chamber variability in the RF filter characteristics and performance, such as in the impedance presented by the RF filter to the RF generator(s) that in turn affect RF power transmission characteristics. Also, in the other possible RF filter configuration, if any component of the RF filter goes bad, the entire RF filter often gets replaced. Thus, having more terminating capacitors in the other possible RF filter configuration can cause an increase in failure rate.

In comparison with the other possible RF filter configuration mentioned above, the RF filter 129 disclosed herein does not include multiple sets of terminating capacitors. The large overall inductance provided by the RF filter 129 disclosed herein avoids the need to use terminating capacitors of smaller capacitance and avoids the need to have an inductor formed around a ferrite core. The RF filter 129 disclosed herein includes the one set of terminating capacitors 143A-143H at the respective locations between the inductor 141 and the electrical connection 137 to the power supply 131. Also, in comparison with the other possible RF filter configuration mentioned above, the RF filter 129 disclosed herein does not utilize terminating capacitors of relatively low capacitance with high manufacturing tolerance. Therefore, the RF filter 129 disclosed herein is able to provide improved channel-to-channel impedance uniformity and corresponding improved chamber-to-chamber impedance uniformity. Also, in comparison with the other possible RF filter configuration mentioned above, the RF filter 129 disclosed herein does not include a ferrite core structure for an inductor defined to filter lower RF frequency, and thereby avoids the large manufacturing variation in permeability associated with ferrite core structures and provides improved chamber-to-chamber impedance uniformity.

Additionally, it should be appreciated that channel-to-channel impedance uniformity and repeatability is improved in the RF filter 129 disclosed herein through use of the cable of the twisted assembly of wires 142 within the inductor 141, which minimizes loading effect on process uniformity. With the RF filter 129, impact of capacitance tolerance on unit-to-unit variability is eliminated. With the RF filter 129, impact of permeability tolerance of ferrite core magnetic material on unit-to-unit variability is eliminated. With the RF filter 129, higher impedance in broadband is achievable to enable frequency tuning. With the RF filter 129, channel-to-channel repeatability provides for minimization of loading effect on process uniformity. With the RF filter 129, higher RF power efficiency is achievable by minimizing RF power loss within the RF filter 129. The RF filter 129 provides high impedance (up to 3 kiloOhms or greater) which minimizes the loading effect of the RF filter 129 and provides a wide bandwidth to enable frequency tuning operating in plasma processes that use level-to-level RF power pulsing schemes. Because the RF filter 129 does not use inter-stage capacitors and does not use ferrite core structures, the impact of capacitance tolerance and permeability tolerance on unit-to-unit variability is eliminated for the RF filter 129. Also, use of twisted magnetic wires in the winding of the RF filter 129 inductor 141 minimizes channel-to-channel variability and thus channel-to-channel loading effect on plasma process uniformity.

Although the foregoing disclosure includes some detail for purposes of clarity of understanding, it will be apparent that certain changes and modifications can be practiced within the scope of the appended claims. Accordingly, the present embodiments are to be considered as illustrative and not restrictive, and what is claimed is not to be limited to the details given herein, but may be modified within the scope and equivalents of the described embodiments.

What is claimed is:

1. A radiofrequency (RF) filter, comprising:
an inductive element including a coil form and at least two coil sections collectively forming an undivided coil of a cable of twisted magnetic wires wrapped around the coil form, the coil form being a hollow cylinder having an inner diameter and an outer diameter, the inner diameter of the coil form defined to provide for cooling air flow through the coil form, each coil section including a portion of the undivided coil of the cable of twisted magnetic wires configured at a corresponding turn pitch, at least two adjacent coil sections having different turn pitches, the cable of twisted magnetic wires including two wires per channel and configured for at least one channel, the cable of twisted magnetic wires at a first end of the inductive element configured for connection to an electrical component that is to receive power from a power supply, the cable of twisted magnetic wires at a second end of the inductive element configured for connection to the power supply;
a set of terminating capacitive elements including a separate terminating capacitive element for each wire of the cable of twisted magnetic wires, each terminating capacitive element electrically connected between a reference ground potential and a respective wire of the cable of twisted magnetic wires at a location between the second end of the inductive element and the power supply; and
a fan positioned at an end of the coil form to move cooling air through the coil form.

2. The RF filter as recited in claim 1, wherein the undivided coil of the cable of twisted magnetic wires has a continuous configuration through each transition between adjacent ones of the at least two coil sections.

3. The RF filter as recited in claim 1, wherein the at least two coil sections are associated with corresponding RF frequencies to be filtered by the RF filter.

4. The RF filter as recited in claim 3, wherein the turn pitch of a given coil section is set to make the given coil section resonant with one of the corresponding RF frequencies to be filtered by the RF filter.

5. The RF filter as recited in claim 1, wherein each wire of the cable of twisted magnetic wires is an electrical conductor coated with an electrical insulating coating material.

6. The RF filter as recited in claim 5, wherein the electrical insulating coating material prevents wire-to-wire conduction of low frequency electrical current and allows wire-to-wire transmission of RF power.

7. The RF filter as recited in claim 1, wherein at least one coil section includes a plurality of turn layers of the cable of twisted magnetic wires, the plurality of turn layers stacked in a radial direction relative to an axis of the inductive element.

8. The RF filter as recited in claim 1, wherein at least two coil sections have different lengths as measured along an axis of the inductive element.

9. The RF filter as recited in claim 1, wherein the undivided coil of the cable of twisted magnetic wires has a different turn diameter in at least two coil sections.

10. The RF filter as recited in claim 1, wherein the undivided coil of the cable of twisted magnetic wires has a different turn shape in at least two coil sections.

11. The RF filter as recited in claim 1, wherein the cable of twisted magnetic wires includes eight wires and is configured for four channels, and the number of the at least two coil sections is two.

12. The RF filter as recited in claim 1, wherein the undivided coil of the cable of twisted magnetic wires has a substantially same turn diameter in the at least two coil sections, the turn pitch of a first coil section that connects to the first end of the inductive element being larger that the turn pitch of a second coil section that connects to the second end of the inductive element.

13. The RF filter as recited in claim 12, wherein the first coil section has a single turn layer of the cable of twisted magnetic wires and the second coil section has two turn layers of the cable of twisted magnetic wires.

14. The RF filter as recited in claim 13, wherein the first coil section has about 13 turns of the cable of twisted magnetic wires within the single turn layer, and the second coil section has about 21 turns of the cable of twisted magnetic wires within an inner turn layer of the two turn layers, and the second coil section has about 18 turns of the cable of twisted magnetic wires within an outer turn layer of the two turn layers, and each terminating capacitive element in the set of terminating capacitive elements having a capacitance value of about 0.1 microFarad.

15. The RF filter as recited in claim 1, wherein a continuous groove is formed within an outer surface of the coil form, the continuous groove configured to receive the cable of twisted magnetic wires and preserve a spatial configuration of the undivided coil of the cable of twisted magnetic wires.

16. A method for filtering radiofrequency (RF) power, comprising:
having an RF filter between a power supply and an electrical component that is to receive power from the power supply, the RF filter including an inductive element having a coil form and at least two coil sections collectively forming an undivided coil of a cable of twisted magnetic wires wrapped around the coil form, the coil form being a hollow cylinder having an inner diameter and an outer diameter, the inner diameter of the coil form defined to provide for cooling air flow through the coil form, each coil section including a portion of the undivided coil of the cable of twisted magnetic wires configured at a corresponding turn pitch, at least two adjacent coil sections having different turn pitches, the cable of twisted magnetic wires including two wires per channel and configured for at least one channel, the cable of twisted magnetic wires at a first end of the inductive element connected to the electrical component, the cable of twisted magnetic wires at a second end of the inductive element connected to the power supply, the RF filter including a separate terminating capacitive element for each wire of the cable of twisted magnetic wires, each terminating capacitive element electrically connected between a reference ground potential and a respective wire of the cable of twisted magnetic wires at a location between the second end of the inductive element and the power supply; and
operating a fan positioned at an end of the coil form to move cooling air through the coil form.

17. The method for filtering RF power as recited in claim 16, wherein a number of the at least two coil sections corresponds to a number of different RF frequencies to be filtered, and wherein the turn pitch of a given coil section is set to make the given coil section resonant with one of the number of different RF frequencies to be filtered.

18. The method for filtering RF power as recited in claim 17, wherein each wire of the cable of twisted magnetic wires is an electrical conductor coated with an electrical insulating coating material that prevents wire-to-wire conduction of low frequency electrical current and allows wire-to-wire transmission of RF power.

19. A method for filtering radiofrequency (RF) power, comprising:
transmitting electrical power from a power supply to wires within an input arrangement, the wires connected to respective capacitive elements, each separate pair of the wires designated to provide electrical power to an electrical component that is exposed to RF power;
passing electrical power from the wires within the input arrangement to corresponding magnetic wires within a cable of twisted magnetic wires at an input of an inductive element, the inductive element including a coil form and at least two coil sections collectively forming an undivided coil of the cable of twisted magnetic wires wrapped around the coil form between the input of the inductive element and an output of the inductive element, the coil form being a hollow cylinder having an inner diameter and an outer diameter, the inner diameter of the coil form defined to provide for cooling air flow through the coil form, each coil section including a portion of the undivided coil of the cable of twisted magnetic wires configured at a corresponding turn pitch, at least two adjacent coil sections having different turn pitches;

passing electrical power from the magnetic wires within the cable of twisted magnetic wires at the output of the inductive element to corresponding wires connected to the electrical component that is exposed to RF power; and operating a fan positioned at an end of the coil form to move cooling air through the coil form.

* * * * *